US012684788B2

(12) United States Patent
Tanaka et al.

(10) Patent No.: US 12,684,788 B2
(45) Date of Patent: Jul. 14, 2026

(54) STORAGE DEVICE

(71) Applicant: Kioxia Corporation, Tokyo (JP)

(72) Inventors: Reika Tanaka, Yokohama Kanagawa (JP); Kunifumi Suzuki, Yokkaichi Mie (JP); Kiwamu Sakuma, Yokkaichi Mie (JP); Yoko Yoshimura, Yokkaichi Mie (JP); Takamasa Hamai, Nagoya Aichi (JP); Kensuke Ota, Yokohama Kanagawa (JP); Yusuke Higashi, Zushi Kanagawa (JP); Yoshiaki Asao, Kawasaki Kanagawa (JP); Masamichi Suzuki, Koto Tokyo (JP)

(73) Assignee: Kioxia Corporation, Tokyo (JP)

( * ) Notice: Subject to any disclaimer, the term of this patent is extended or adjusted under 35 U.S.C. 154(b) by 347 days.

(21) Appl. No.: 18/589,342

(22) Filed: Feb. 27, 2024

(65) Prior Publication Data

US 2024/0324238 A1 Sep. 26, 2024

(30) Foreign Application Priority Data

Mar. 20, 2023 (JP) ................................. 2023-044601

(51) Int. Cl.
| | |
|---|---|
| *H10D 1/68* | (2025.01) |
| *H01G 4/10* | (2006.01) |
| *H01G 4/12* | (2006.01) |
| *H01G 7/02* | (2006.01) |
| *H01G 7/06* | (2006.01) |
| H10B 53/30 | (2023.01) |

(52) U.S. Cl.
CPC ................. *H10D 1/68* (2025.01); *H01G 4/10* (2013.01); *H01G 4/1236* (2013.01); *H01G*

*7/026* (2013.01); *H01G 7/028* (2013.01); *H01G 7/06* (2013.01); *H10B 53/30* (2023.02)

(58) Field of Classification Search
CPC ........ H01G 7/025; H01G 7/026; H01G 7/028; H01G 7/06; H01G 4/10; H01G 4/1209–1263; H10B 53/00; H10B 53/30; H10D 1/68; H10D 1/684; H10D 30/0415; H10D 30/701; H10D 30/0411; H10D 30/0413; H10D 64/033; H10D 64/035; H10D 64/681; H10D 64/685; H10D 64/689; H10D 64/691; H10D 64/037
See application file for complete search history.

(56) References Cited

U.S. PATENT DOCUMENTS 10,763,360 B2 9/2020 Yoo
2015/0380477 A1* 12/2015 Huang ..................... H10D 1/68
257/532

(Continued)

OTHER PUBLICATIONS

M. Pešić, et al., "Comparative Study of Reliability of Ferroelectric and Anti-Ferroelectric Memories," in IEEE Transactions on Device and Materials Reliability, vol. 18, No. 2, pp. 154-162, Jun. 2018 doi: 10.1109/TDMR.2018.2829112.

*Primary Examiner* — Yu Chen
(74) *Attorney, Agent, or Firm* — Kim & Stewart LLP

(57) ABSTRACT

A storage device includes a first electrode, a second electrode, a first dielectric layer between the first and second electrodes and including oxygen and at least one of hafnium and zirconium, a second dielectric layer between the first electrode and the first dielectric layer, and an intermediate region between the first and second dielectric layers and in which a plurality of metallic portions are provided.

19 Claims, 16 Drawing Sheets

(56) References Cited

U.S. PATENT DOCUMENTS

| | | | |
|---|---|---|---|
| 2017/0213869 A1* | 7/2017 | Read | H10B 63/80 |
| 2019/0180934 A1* | 6/2019 | Popovici | H01G 4/008 |
| 2021/0359101 A1 | 11/2021 | Heo et al. | |
| 2021/0408223 A1* | 12/2021 | Chia | H10D 1/684 |
| 2022/0352187 A1 | 11/2022 | Jeon et al. | |
| 2023/0099330 A1* | 3/2023 | Koo | H10D 30/6891 |
| | | | 257/295 |

* cited by examiner

WORD LINE CONTROL CIRCUIT

MEMORY CELL ARRAY REGION    ~100

110

BIT LINE CONTROL CIRCUIT    ~120

STORAGE DEVICE

CROSS-REFERENCE TO RELATED APPLICATION(S)

This application is based upon and claims the benefit of priority from Japanese Patent Application No. 2023-044601, filed Mar. 20, 2023, the entire contents of which are incorporated herein by reference.

FIELD

Embodiments described herein relate generally to a storage device.

BACKGROUND

A storage device using a capacitor including a dielectric layer having anti-ferroelectricity as a storage element has been proposed.

BRIEF DESCRIPTION OF THE DRAWINGS

FIGS. 3-6 are diagrams showing the principle of operation of the storage device.

FIG. 7 is a block diagram showing an overall configuration of the storage device that is applied to a nonvolatile RAM.

FIG. 8 is an electric circuit diagram showing a part of a memory cell array region of the storage device that is applied to the nonvolatile RAM.

FIGS. 12A-12E are diagrams showing a specific operation of the storage device.

FIGS. 13A-13C are diagrams showing a specific operation of the storage device.

DETAILED DESCRIPTION

Embodiments provide a storage device having excellent nonvolatile storage characteristics.

In general, according to one embodiment, a storage device includes a first electrode, a second electrode, a first dielectric layer between the first and second electrodes and including oxygen and at least one of hafnium and zirconium, a second dielectric layer between the first electrode and the first dielectric layer, and an intermediate region between the first and second dielectric layers and in which a plurality of metallic portions are provided.

Hereinafter, embodiments will be described with reference to the drawings.

Figure 1:
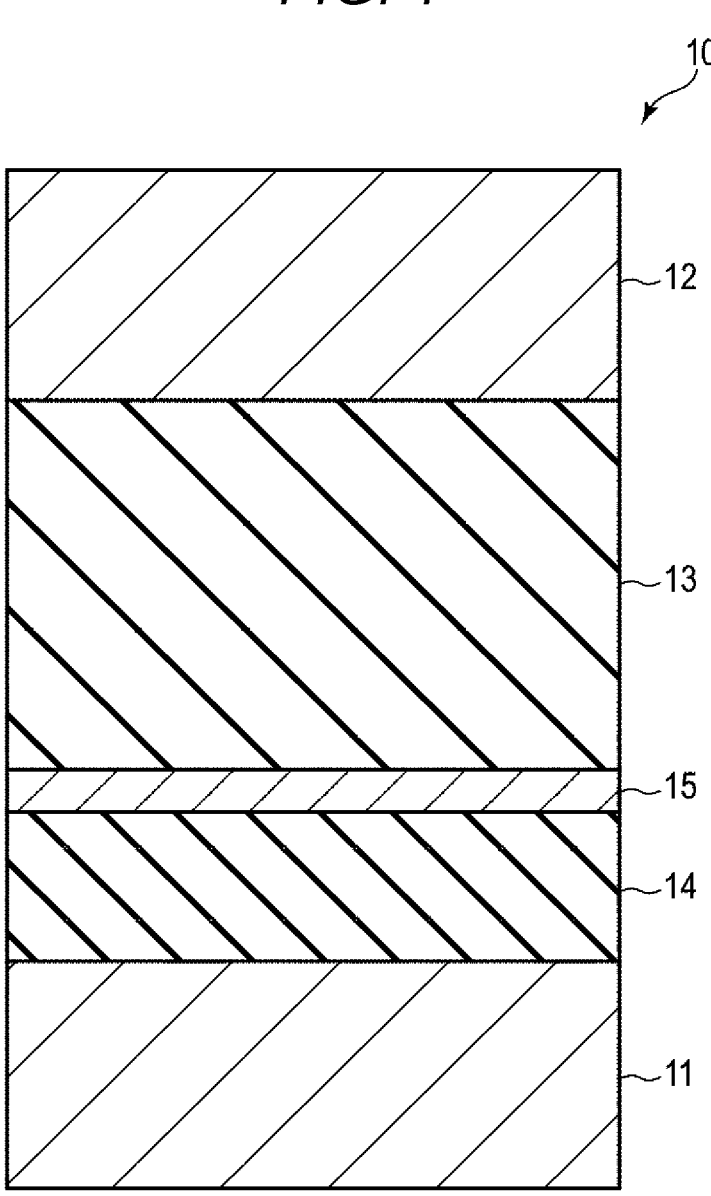
FIG. 1 is a schematic cross-sectional view showing a configuration of a capacitor of a storage device according to an embodiment.

FIG. 1 is a schematic cross-sectional view showing a configuration of a nonvolatile storage device according to an embodiment.

In the storage device according to the present embodiment, a capacitor 10 is used as the storage element. The capacitor 10 includes a first electrode (or a lower electrode) 11, a second electrode (or an upper electrode) 12, a first dielectric layer 13, a second dielectric layer 14, and an intermediate region 15.

The first electrode 11 and the second electrode 12 are formed of a conductive material such as a metal material, and a stacked structure is provided between the first electrode 11 and the second electrode 12, including the first dielectric layer 13, the second dielectric layer 14, and the intermediate region 15.

The first dielectric layer 13 is provided between the first electrode 11 and the second electrode 12 and contains at least one of hafnium (Hf) and zirconium (Zr) and oxygen (O). In the present embodiment, the first dielectric layer 13 is formed of hafnium oxide ($HfO_2$) containing hafnium (Hf) and oxygen (O). The first dielectric layer 13 has anti-ferroelectricity. In addition, the first dielectric layer 13 has a higher relative permittivity than the second dielectric layer 14.

The second dielectric layer 14 is provided between the first electrode 11 and the first dielectric layer 13 and contains silicon (Si) and oxygen (O). Specifically, the second dielectric layer 14 is formed of silicon oxide (SiO2). A thickness of the second dielectric layer 14 is preferably 4 nm or less, and more preferably 1 nm or more.

The intermediate region 15 is provided between the first dielectric layer 13 and the second dielectric layer 14 and contains a predetermined metallic element. In the present embodiment, titanium (Ti) is used as the predetermined metallic element contained in the intermediate region 15. In addition, the intermediate region 15 may further contain nitrogen (N). In the present embodiment, the intermediate region 15 is formed of titanium nitride (TiN). The intermediate region 15 may be continuously provided with a single layer formed of a nitride or the like of the predetermined metallic element, but due to the intermediate region 15 having a substantially extremely small thickness, typically, a plurality of portions containing the predetermined metallic element and nitrogen are discretely provided. That is, in the intermediate region 15, typically, the plurality of portions formed of a nitride or the like of the predetermined metallic element are discretely provided.

Figure 2:
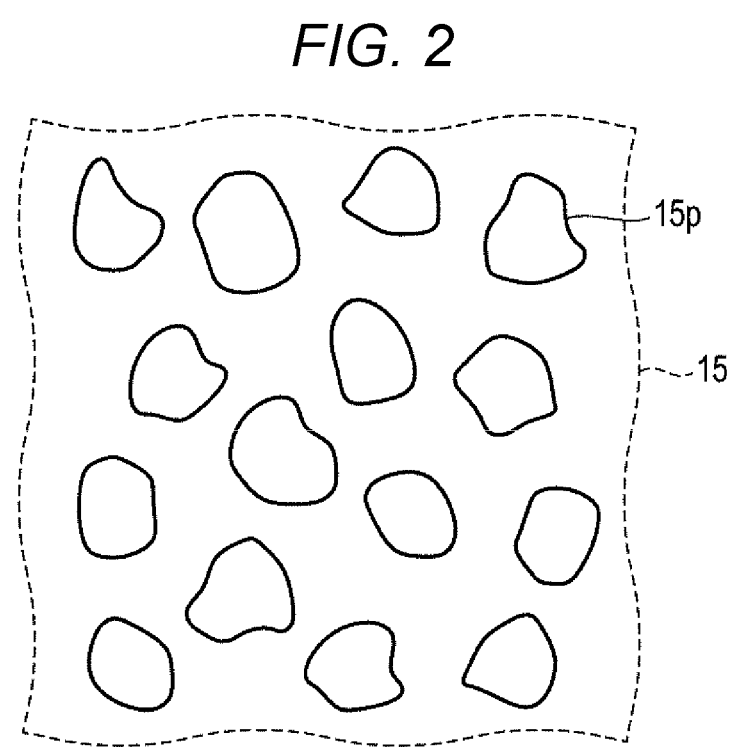
FIG. 2 is a schematic plan view showing a configuration of an intermediate region of the capacitor of the storage device.

FIG. 2 is a schematic plan view showing a configuration of the intermediate region 15. As shown in FIG. 2, the intermediate region 15 has a structure in which a plurality of metal-containing portions 15p containing the predetermined metallic element are discretely provided. Specifically, in the present embodiment, the metal-containing portion 15p contains titanium nitride (TiN).

The intermediate region 15 is in contact with each of the first dielectric layer 13 and the second dielectric layer 14. Therefore, the predetermined metallic element contained in the intermediate region 15 may be diffused into the first dielectric layer 13 and the second dielectric layer 14. In this case, a concentration of the predetermined metallic element (Ti) contained in the first dielectric layer 13 decreases as a distance from the intermediate region 15 increases, and a concentration of the predetermined metallic element (Ti) contained in the second dielectric layer 14 decreases as a distance from the intermediate region 15 increases.

As described above, in the present embodiment, a capacitor is used as the storage element. Therefore, in the present embodiment, as in a normal dielectric memory, data is stored based on a first state where charge is stored in the capacitor 10 (i.e., a state where a predetermined amount or more of charges are stored in the capacitor 10) and a second state where charge is erased from the capacitor 10 (i.e., a state where a predetermined amount or more of charges are not stored in the capacitor 10). Specifically, in the present embodiment, data is stored using the anti-ferroelectricity of the first dielectric layer 13. By using the first dielectric layer 13 having the anti-ferroelectricity, it is possible to obtain a storage device having high cycle resistance and a low operating voltage.

Next, the principle of operation of the storage device according to the present embodiment will be described with reference to FIGS. 3 to 6.

Figure 3:
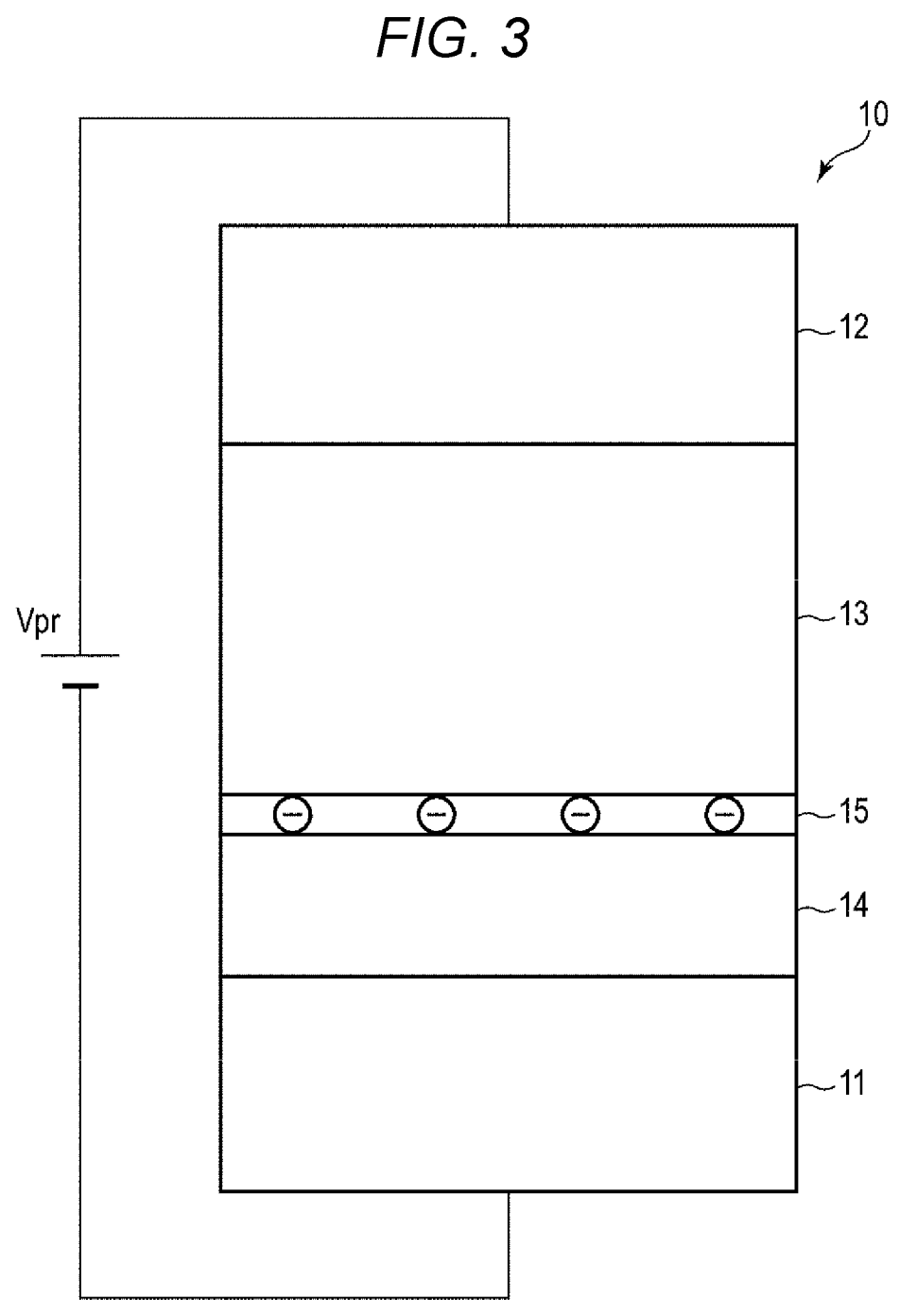
Figure 4:
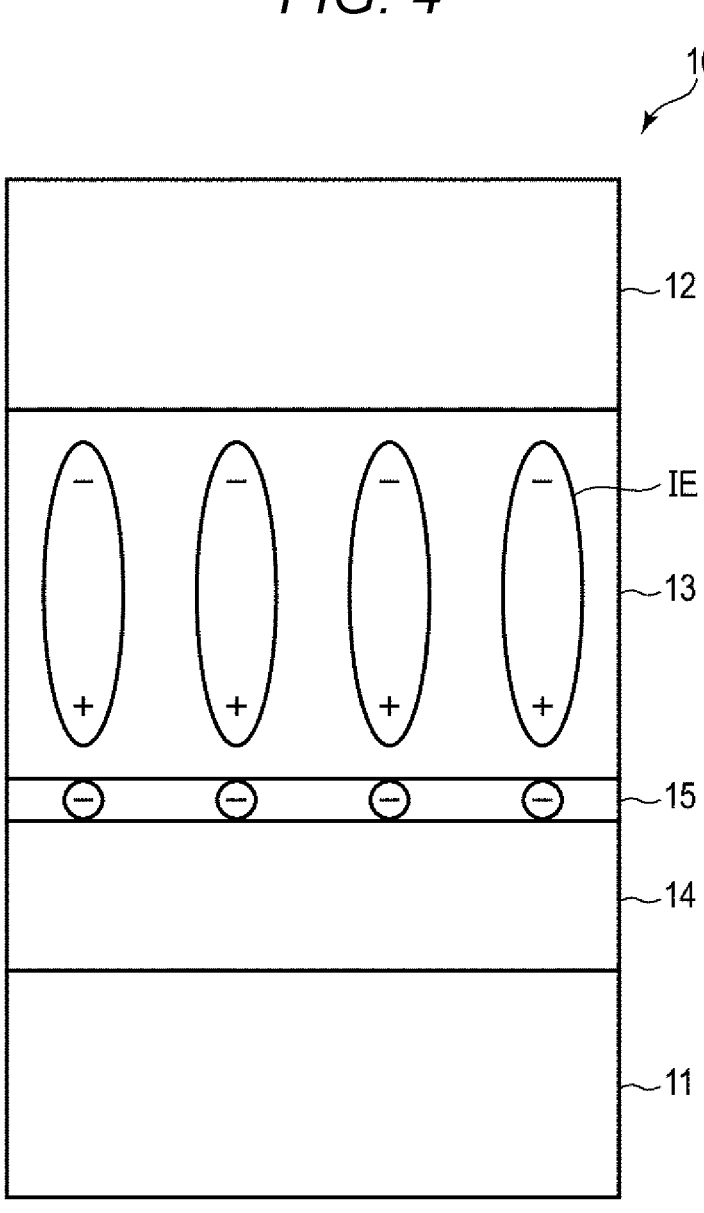
Figure 5:
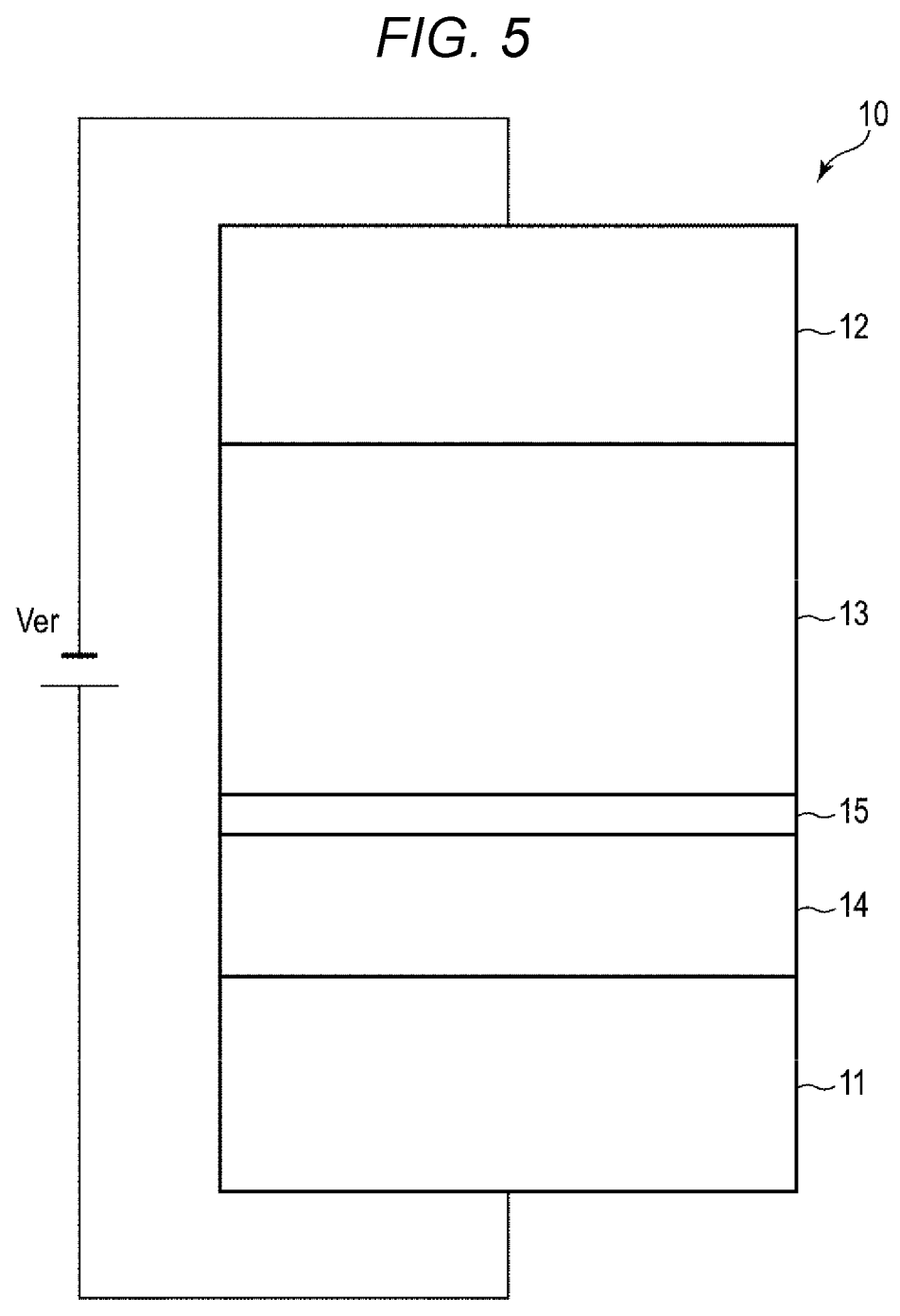

FIG. 3 is a diagram schematically showing a state of the capacitor 10 when a voltage is applied to the capacitor 10 and the capacitor 10 is set to a first state. FIG. 4 is a diagram schematically showing a state of the capacitor 10 when the voltage applied to the capacitor 10 becomes zero after the capacitor 10 is set to the first state. FIG. 5 is a diagram schematically showing a state of the capacitor 10 when a voltage is applied to the capacitor 10 and the capacitor 10 is set to a second state.

Figure 6:
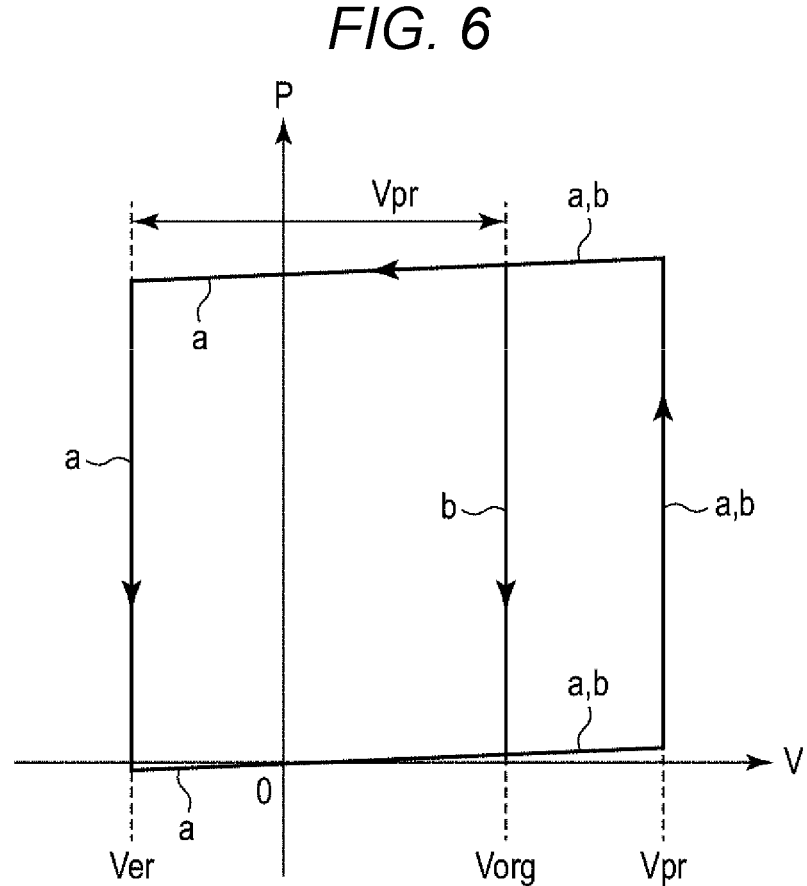

FIG. 6 is a diagram schematically showing a relationship between a voltage V applied to the capacitor 10 and a polarization P of the capacitor 10. A characteristic "a" is a characteristic when a capacitor structure of the present embodiment (i.e., a structure in which the intermediate region 15 is provided) is used, and a characteristic "b" is a characteristic when a capacitor structure of a comparative example (i.e., a structure in which the intermediate region 15 is not provided) is used. A voltage Vpr is an applied voltage when the polarization is generated in the capacitor 10, and is basically the same value when the capacitor structure of the present embodiment is used and when the capacitor structure of the comparative example is used.

As shown in FIG. 3, when the first state where the charge is stored in the capacitor 10 is set, the voltage Vpr (i.e., the program voltage) is applied between the first electrode 11 and the second electrode 12 such that the potential of the second electrode 12 is higher than the potential of the first electrode 11. That is, the voltage Vpr is applied to the capacitor 10. As a result, as shown in FIG. 6, the capacitor 10 is polarized. Actually, it is preferable to apply a voltage Vpr+α slightly higher than the voltage Vpr to the capacitor 10 so that the polarization is reliably generated in the capacitor 10. In the present embodiment, to simplify the description, it is assumed and described that the polarization occurs in the capacitor 10 by applying the voltage Vpr to the capacitor 10. When the voltage Vpr is applied to the capacitor 10, a charge corresponding to the voltage Vpr is stored in the capacitor 10. Specifically, as described below, the voltage Vpr is substantially applied to the first dielectric layer 13.

In the present embodiment, as described above, the intermediate region 15 containing titanium nitride (TiN) is provided between the first dielectric layer 13 and the second dielectric layer 14. When such a structure is used, a charge trap based on titanium nitride is present in the intermediate region 15. Therefore, when the voltage Vpr is applied between the first electrode 11 and the second electrode 12, a negative charge is trapped in the charge trap in the intermediate region 15, and the charge corresponding to the voltage Vpr is stored in the intermediate region 15.

In addition, since the voltage Vpr applied to the capacitor 10 is substantially applied to the first dielectric layer 13, the following equation is true:

$$Q = C1 \times Vpr$$

where C1 denotes the capacitance of the first dielectric layer 13, and Q denotes the amount of charge stored in the intermediate region 15.

As shown in FIG. 4, after the capacitor 10 is set to the first state, the negative charges trapped in the intermediate region 15 are stored in the intermediate region 15 even after the voltage applied to the capacitor 10 (i.e., the voltage applied between the first electrode 11 and the second electrode 12) becomes zero. Therefore, an internal charge IE caused by the negative charge stored in the intermediate region 15 is generated in the first dielectric layer 13, and a charge based on the charge trapped in the intermediate region 15 is stored in the capacitor 10. That is, as shown in FIG. 6, the polarization generated in the capacitor 10 by the internal charge IE is maintained even after the voltage applied to the capacitor 10 becomes zero. An internal charge IE is determined by the amount of charge Q stored in the intermediate region 15. That is, a value of the internal charge IE is determined by a value of the voltage Vpr.

As shown in FIG. 5, when the second state where the charge is erased from the capacitor 10 is set, a voltage Ver (i.e., an erase voltage) is applied between the first electrode 11 and the second electrode 12 such that the potential of the second electrode 12 is lower than the potential of the first electrode 11. That is, the voltage Ver having a polarity opposite to the polarity of the voltage Vpr is applied to the capacitor 10. Specifically, the voltage Ver represented by Ver=Vorg−Vpr is applied to the capacitor 10. The voltage Vorg is the erase voltage in the capacitor structure of the comparative example (i.e., the structure in which the intermediate region 15 is not provided) as shown in FIG. 6.

As described above, the first dielectric layer 13 has the internal charge IE caused by the negative charge stored in the intermediate region 15. As described above, the voltage based on the internal charge IE is Vpr. Therefore, in order to erase the charge stored in the capacitor 10, that is, to erase the charge stored in the intermediate region 15, as shown in FIG. 6, it is necessary to apply a voltage obtained by subtracting the voltage Vpr for canceling the internal charge IE from the voltage Vorg to the capacitor 10. Therefore, the erase voltage Ver applied to the capacitor 10 is expressed as Vorg−Vpr as described above. As is clear from FIG. 6, the erase voltage Ver has negative polarity, and the absolute value of the erase voltage Ver is smaller than the absolute value of the program voltage Vpr.

By applying the voltage Ver to the capacitor 10, the charge trapped in the intermediate region 15 is released from the trap, and the charge stored in the capacitor 10 is erased. As a result, as shown in FIG. 6, the polarization of the capacitor 10 becomes substantially zero.

As described above, in the capacitor structure of the comparative example (i.e., the structure in which the intermediate region 15 is not provided), the erase voltage Vorg has a positive value. Therefore, in a case of the capacitor structure of the comparative example, after the capacitor is set to the first state by applying the program voltage Vpr, when the voltage applied to the capacitor becomes zero, the charge stored in the capacitor 10 is erased. That is, in a case of the capacitor structure of the comparative example, it is not possible to obtain a storage device having non-volatility.

In the present embodiment, as described above, the erase voltage Ver has a negative value. Therefore, even when the voltage applied to the capacitor 10 becomes zero, the charge stored in the capacitor 10 is stored in the capacitor 10 without being erased. Therefore, in the present embodiment, it is possible to obtain a storage device having non-volatility by providing the intermediate region 15.

Figures 7, 8:
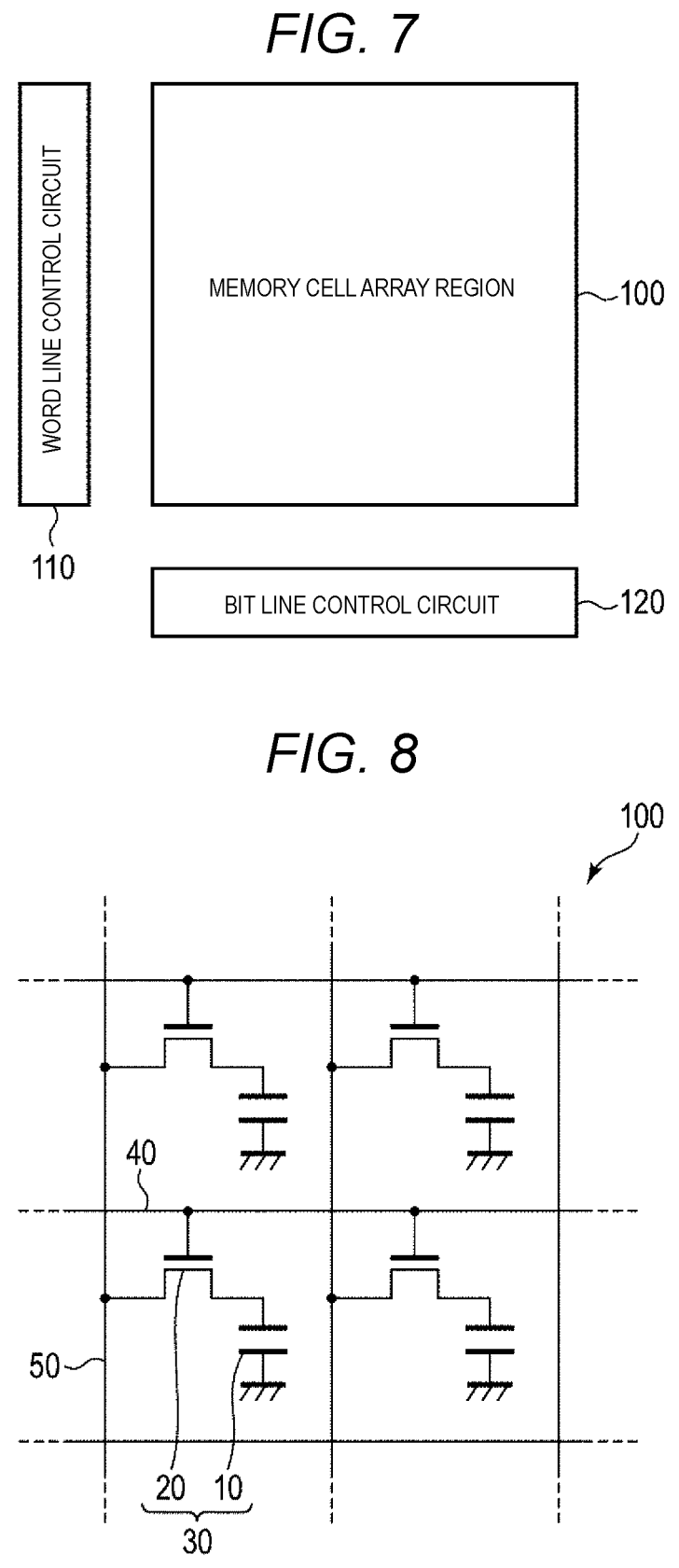

Next, a case where the above-described capacitor 10 is applied to a nonvolatile RAM will be described. FIG. 7 is a block diagram showing an overall configuration of the nonvolatile RAM. FIG. 8 is an electric circuit diagram showing a part of a memory cell array region of the nonvolatile RAM.

As shown in FIG. 7, the nonvolatile RAM of the present embodiment includes a memory cell array region 100, a word line control circuit 110, and a bit line control circuit 120.

As shown in FIG. 8, a plurality of memory cells 30 are provided in the memory cell array region 100, and each memory cell 30 includes the capacitor 10 and a transistor 20 connected in series. A word line 40 is a wiring connected to the gate of the transistor 20, a bit line 50 is a wiring connected to one terminal of the source and the drain of the transistor 20, and the capacitor 10 is connected to the other terminal.

When writing to or reading is performed on the memory cell 30, the transistor 20 provided in the selected memory cell 30 is set to an on state via the word line 40 connected to the selected memory cell 30. When writing is performed, the capacitor 10 provided in the selected memory cell 30 is set to the first state or the second state via the bit line 50 connected to the selected memory cell 30. When reading is performed, the first state or the second state set in the capacitor 10 provided in the selected memory cell 30 is detected via the bit line 50 connected to the selected memory cell 30.

Next, a specific operation of the storage device according to the present embodiment will be described with reference to FIGS. 9A to 9C, FIGS. 10A to 10C, FIGS. 11A to 11C, FIGS. 12A to 12E, and FIGS. 13A to 13C. That is, a specific operation that is performed when the above-described capacitor 10 is applied to the nonvolatile RAM will be described. In each figure, the horizontal axis is the applied voltage V to the capacitor 10 (i.e., the voltage applied to the second electrode 12 with the first electrode 11 as a reference). The vertical axis is the amount of polarization P of the capacitor 10 and corresponds to the amount of charge stored in the capacitor 10.

First, an operation that is performed when the capacitor 10 is set to an erased state will be described. That is, the operation that is performed when the capacitor 10 is set to the second state will be described.

Figure 9A:
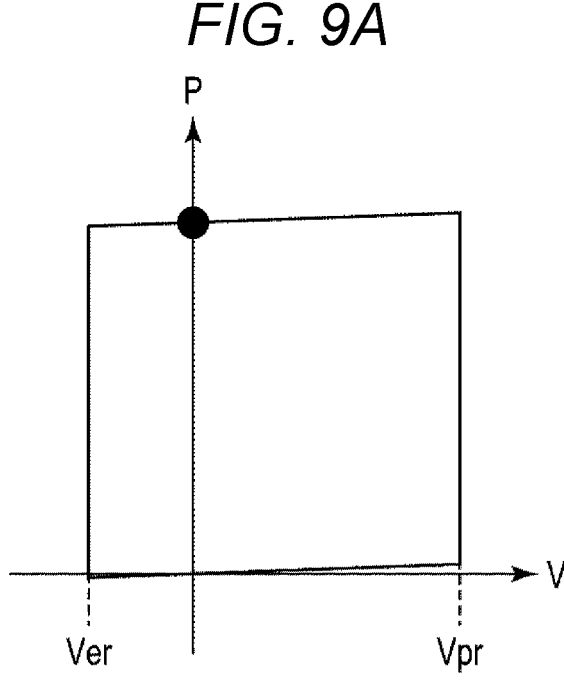
FIGS. 9A-9C are diagrams showing a specific operation of the storage device.
Figure 9B:
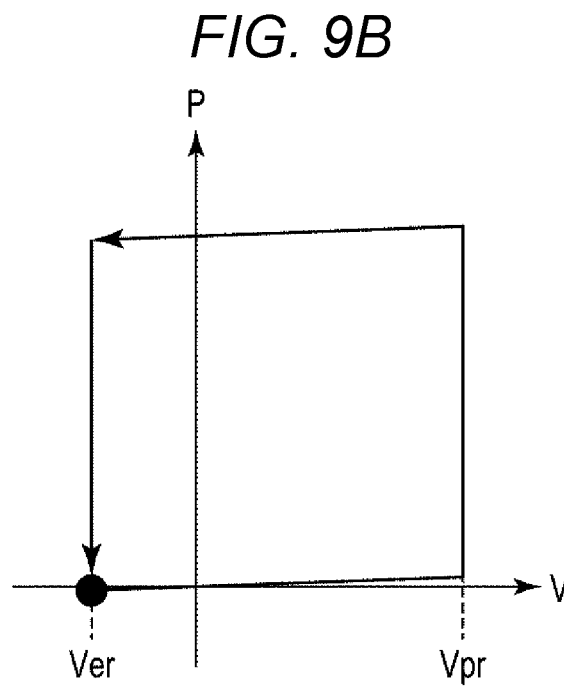
Figures 9C, 10A:
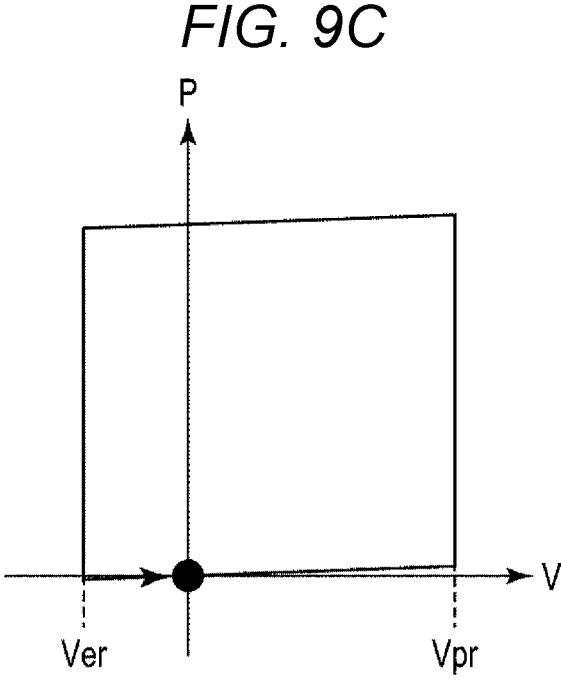
FIGS. 10A-10C are diagrams showing a specific operation of the storage device.

FIGS. 9A to 9C are diagrams showing the erase operation that is performed when the capacitor 10 is set to the first state (i.e., a state where charge is stored in the capacitor 10).

FIG. 9A shows a state in which the capacitor 10 is set to the first state, where the charge is stored in the capacitor 10, and the charge is trapped in the intermediate region 15. In this state, as shown in FIG. 9B, the erase voltage Ver is applied to the capacitor 10, so that the charge stored in the capacitor 10 is erased, and the charge trapped in the intermediate region 15 is released from the intermediate region 15. Thereafter, as shown in FIG. 9C, the erase operation is completed by setting the applied voltage to the capacitor 10 to zero.

Figure 10B:
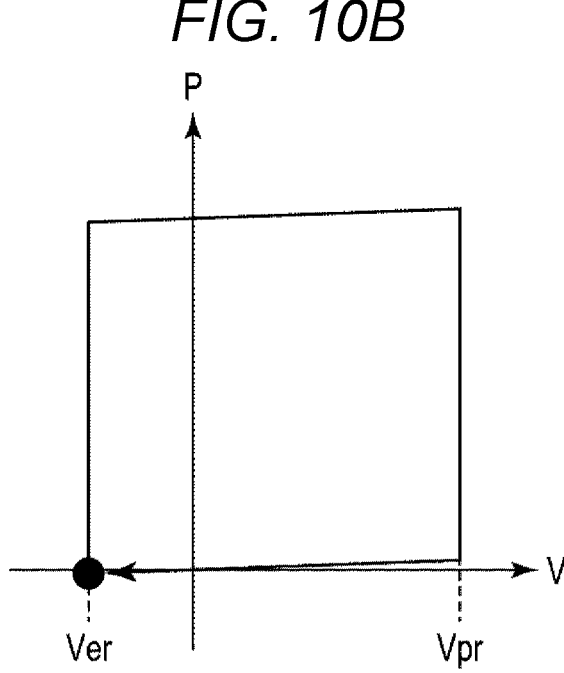
Figure 10C:
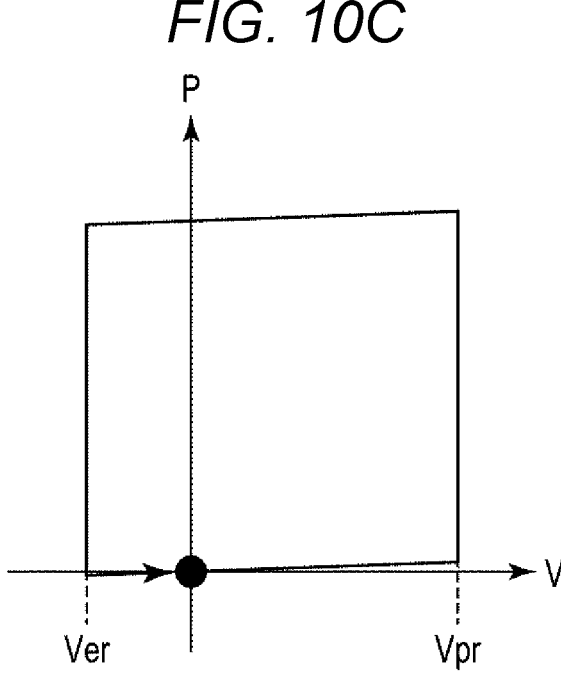

FIGS. 10A to 10C are diagrams showing the erase operation when the capacitor 10 is set to the second state (i.e., a state where no charge is stored in the capacitor 10). The basic voltage application operation is the same as the voltage application operation when the capacitor 10 described above is set to the first state.

FIG. 10A shows a state in which the capacitor 10 is set to the second state, where no charge is stored in the capacitor 10. In this state, as shown in FIG. 10B, the erase voltage Ver is applied to the capacitor 10. Thereafter, as shown in FIG. 10C, the erase operation is completed by setting the applied voltage to the capacitor 10 to zero.

Next, an operation that is performed when writing is performed on the capacitor 10 will be described. That is, the operation that is performed when the capacitor 10 is set to the first state or the second state will be described.

Figure 11A:
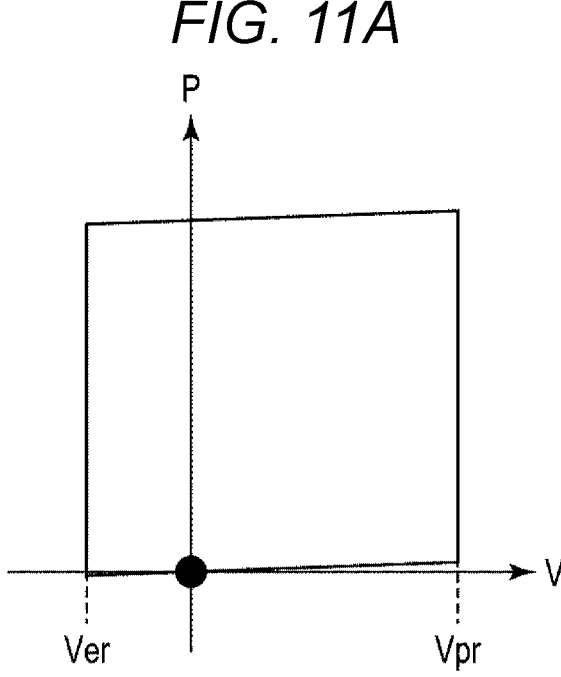
FIGS. 11A-11C are diagrams showing a specific operation of the storage device.
Figure 11B:
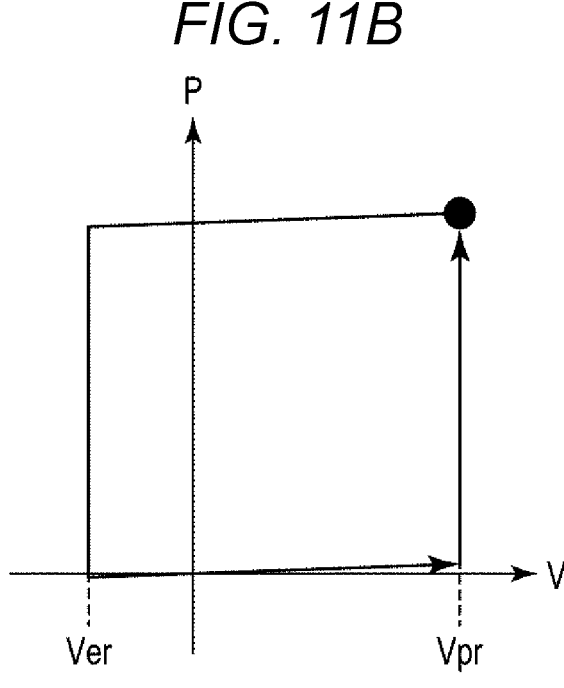
Figure 11C:
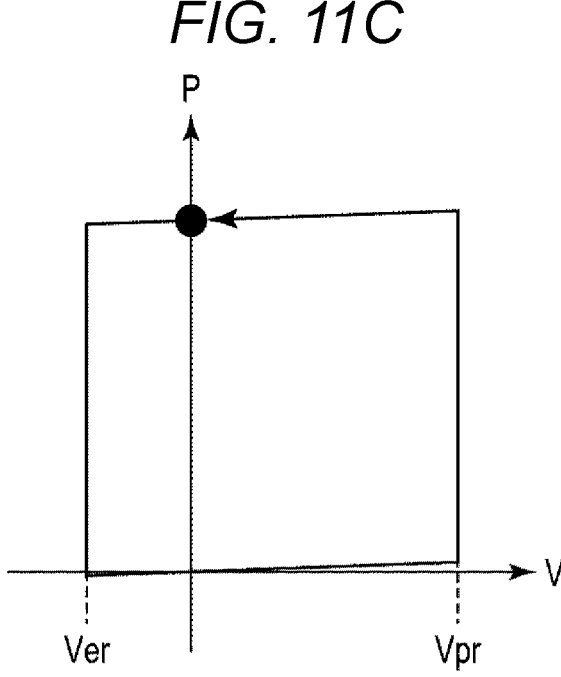

FIGS. 11A to 11C are diagrams showing a write operation when the first state is set in the capacitor 10.

First, as shown in FIG. 11A, the capacitor is set to the erased state by the operation shown in FIG. 9A to FIG. 9C or FIG. 10A to FIG. 10C described above. In this state, no charge is stored in the capacitor 10, and no charge is trapped in the intermediate region 15.

Next, as shown in FIG. 11B, by applying the program voltage Vpr to the capacitor 10, the charge is stored in the capacitor 10, and the charge is trapped in the intermediate region 15. Accordingly, the capacitor 10 is set to the first state.

FIG. 11C shows a state after a certain time elapses from a state where the capacitor 10 is set to the first state by applying the program voltage Vpr to the capacitor 10. After the transistor 20 is set to the on state and the program voltage Vpr is applied to the capacitor 10, the transistor 20 is set to an off-state, and the capacitor 10 is set to be in a floating state. In the present embodiment, even if the voltage applied to the capacitor 10 eventually becomes zero as time elapses after the capacitor 10 transitions to the floating state, the charge is trapped in the intermediate region 15 of the capacitor 10. Therefore, the charge is stored in the capacitor 10 by the internal electric field generated by the trapped charge.

As described above, the first state is set in the capacitor 10.

In the write operation that is performed when the second state is set in the capacitor 10, the operation shown in FIGS. 9A to 9C or FIGS. 10A to 10C described above may be simply performed. As a result, the capacitor 10 is set to the erased state, that is, the second state.

Next, an operation that is performed when reading is performed on the capacitor 10 will be described. That is, the operation that is performed when the first state or the second state set in the capacitor 10 is detected will be described.

FIGS. 12A to 12E are diagrams showing a read operation that is performed when the first state is set in the capacitor 10.

Figure 12A:
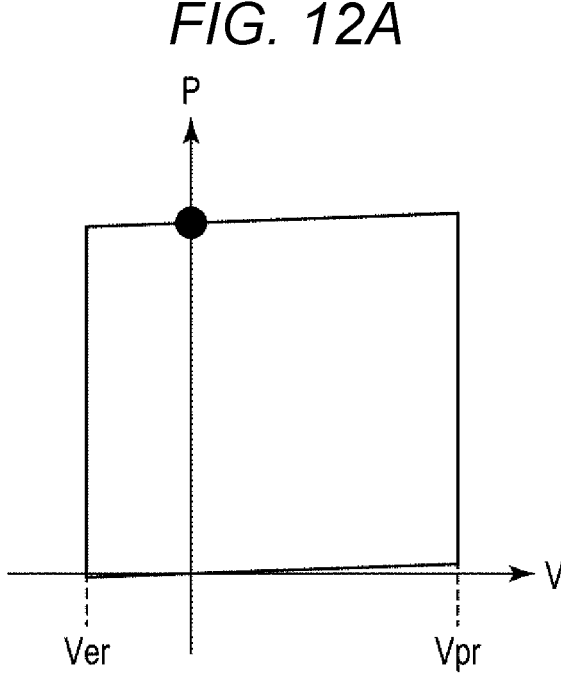

FIG. 12A shows a state in which the capacitor 10 is set to the first state, where the charge is stored in the capacitor 10, and the charge is trapped in the intermediate region 15.

Figures 12B, 12C:
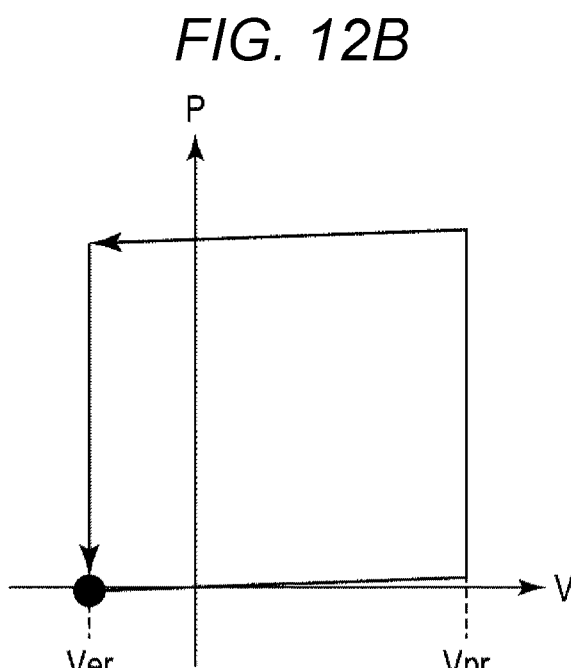

In the state of FIG. 12A, as shown in FIG. 12B, the erase voltage Ver is applied to the capacitor 10 as the read voltage. As a result, the charge stored in the capacitor 10 is read to the bit line 50 via the transistor 20, and it is detected that the capacitor 10 is set to the first state based on the current or the potential change due to the charge. In addition, the charge stored in the capacitor 10 is erased by the read operation, and the charge trapped in the intermediate region 15 is released from the intermediate region 15.

Thereafter, as shown in FIG. 12C, the read operation is completed by setting the applied voltage to the capacitor 10 to zero.

As described above, the reading of the charge stored in capacitor 10 to the bit line 50 corresponds to the erasing of the charge stored in the capacitor 10. Therefore, in order to return the capacitor 10 to the first state, it is necessary to rewrite the capacitor 10.

Figures 12D, 12E:
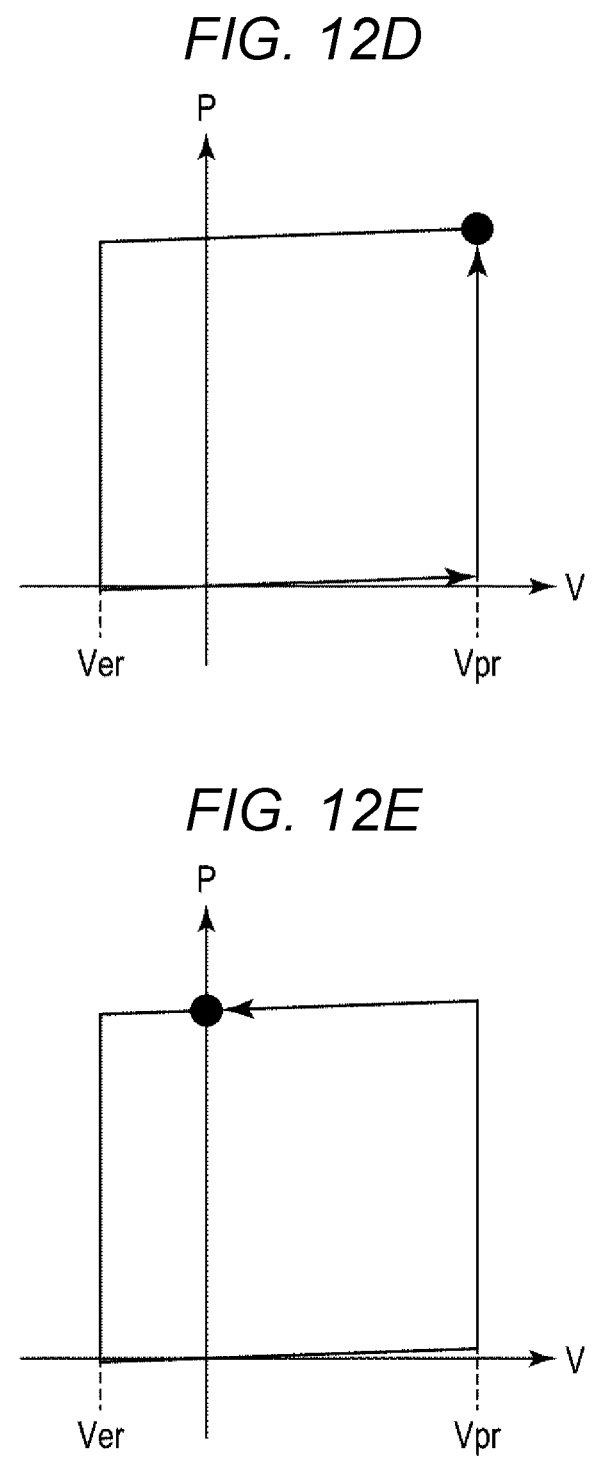

FIGS. 12D and 12E show a rewrite operation, and the rewriting is performed in the same manner as the write operation shown in FIGS. 11B and 11C.

Figures 13A, 13B:
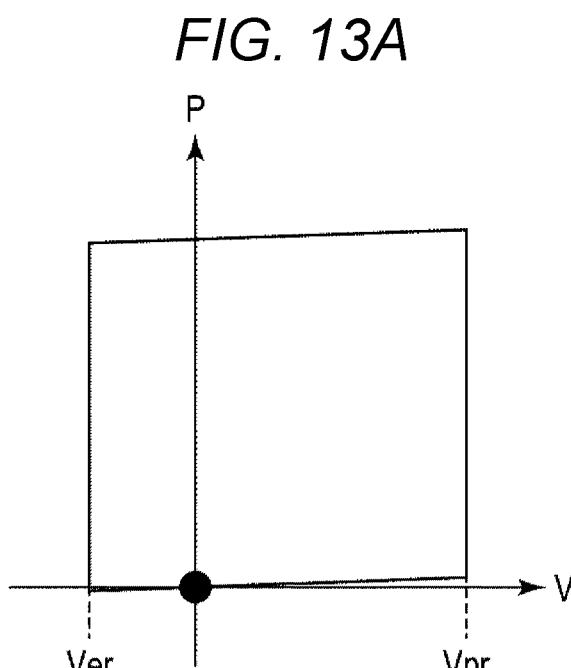
Figure 13C:
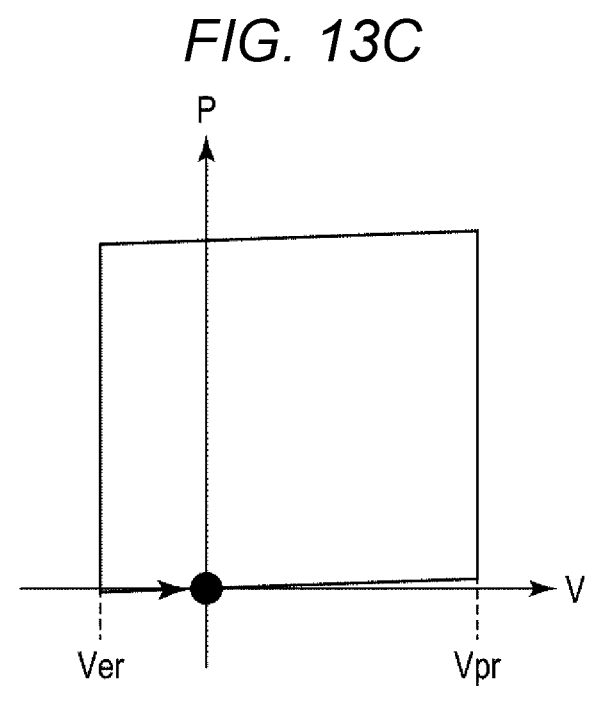

FIGS. 13A to 13C are diagrams showing a read operation that is performed when the second state is set in the capacitor 10.

FIG. 13A shows a state in which the capacitor 10 is set to the second state, where no charge is stored in the capacitor 10. In this state, as shown in FIG. 13B, the erase voltage Ver is applied to the capacitor 10 as the read voltage. Thereafter, as shown in FIG. 13C, the read operation is completed by setting the applied voltage to the capacitor 10 to zero. When the capacitor 10 is set to the second state, since no charge is stored in the capacitor 10, it is detected that the capacitor 10 is set to the second state without any current or potential change occurring due to the charge transfer. In addition, since the amount of the charge of the capacitor 10 does not change in the read operation, the rewrite operation is not performed.

As described above, in the present embodiment, even when the voltage applied to the capacitor 10 becomes zero, the charge is stored in the capacitor 10 by the internal electric field based on the charge trapped in the intermediate region 15. Therefore, in the present embodiment, it is possible to obtain an excellent storage device having non-volatility.

In the above-described embodiment, when the first dielectric layer 13 contains both hafnium (Hf) and zirconium (Zr), a concentration of zirconium (Zr) in the first dielectric layer 13 is preferably higher than a concentration of hafnium (Hf) in the first dielectric layer 13.

In addition, in the above-described embodiment, the first dielectric layer 13 may further contain at least one of silicon (Si) and aluminum (Al) in addition to at least one of hafnium (Hf) and zirconium (Zr) and oxygen (O). Specifically, in the first dielectric layer 13, at least one of silicon (Si) and aluminum (Al) may be added to an oxide containing at least one of hafnium (Hf) and zirconium (Zr).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device, comprising:

a first electrode;

a second electrode;

a first dielectric layer between the first and second electrodes, and comprising a first dielectric material including oxygen and at least one of hafnium and zirconium;

a second dielectric layer between the first electrode and the first dielectric layer, and comprising a second dielectric material different from the first dielectric material; and an intermediate region between the first and second dielectric layers and in which a plurality of discrete metallic portions are provided, wherein the discrete metallic portions include metallic elements, wherein each of the first and second dielectric layers includes metallic elements that are same as the metallic elements included in the plurality of discrete metallic portions, a concentration of the metallic elements in the first dielectric material decreases as a distance from the intermediate region increases, and a concentration of the metallic elements in the second dielectric material decreases as a distance from the intermediate region increases.

2. The storage device according to claim 1, wherein the intermediate region stores charges when a voltage applied to the second electrode is higher than a voltage applied to the first electrode, and erases charges when a voltage applied to the second electrode is less than a voltage applied to the first electrode.

3. The storage device according to claim 1, wherein the metallic portions include titanium.

4. The storage device according to claim 3, wherein the intermediate region includes nitrogen.

5. The storage device according to claim 1, wherein the first dielectric layer has anti-ferroelectricity.

6. The storage device according to claim 1, wherein the first dielectric layer has a higher relative permittivity than the second dielectric layer.

7. The storage device according to claim 1, wherein the first dielectric layer includes at least one of silicon and aluminum.

8. The storage device according to claim 1, wherein the first dielectric layer includes both hafnium and zirconium, and a concentration of zirconium in the first dielectric layer is higher than a concentration of hafnium in the first dielectric layer.

9. The storage device according to claim 1, wherein the second dielectric layer includes silicon and oxygen.

10. The storage device according to claim 1, wherein the second dielectric layer has a thickness of 4 nm or less.

11. A storage device, comprising:

a first electrode;

a second electrode;

a first dielectric layer between the first and second electrodes, and comprising a first dielectric material including oxygen and at least one of hafnium and zirconium;

a second dielectric layer between the first electrode and the first dielectric layer, and comprising a second dielectric material different from the first dielectric material; and an intermediate region between the first and second dielectric layers and including a plurality of discrete metallic elements, wherein each of the first and second dielectric layers includes metallic elements that are same as the metallic elements included in the intermediate region, a concentration of the metallic elements in the first dielectric material decreases as a distance from the intermediate region increases, a concentration of the metallic elements in the second dielectric material decreases as a distance from the intermediate region increases, and wherein the intermediate region transitions to a first state when a voltage applied to the second electrode is higher than a voltage applied to the first electrode, the intermediate region transitions to a second state when a voltage applied to the second electrode is lower than a voltage applied to the first electrode, and an absolute value of the voltage applied to the second electrode in transition to the first state is greater than an absolute value of the voltage applied to the second electrode in transition to the second state.

12. The storage device according to claim 11, wherein the intermediate region includes titanium as the metallic elements.

13. The storage device according to claim 12, wherein the intermediate region includes nitrogen.

14. The storage device according to claim 11, wherein the first dielectric layer has anti-ferroelectricity.

15. The storage device according to claim 11, wherein the first dielectric layer has a higher relative permittivity than the second dielectric layer.

16. The storage device according to claim 11, wherein the first dielectric layer includes at least one of silicon and aluminum.

17. The storage device according to claim 11, wherein the first dielectric layer includes both hafnium and zirconium, and a concentration of zirconium in the first dielectric layer is higher than a concentration of hafnium in the first dielectric layer.

18. The storage device according to claim 11, wherein the second dielectric layer includes silicon and oxygen.

19. A storage device, comprising:

a plurality of first wirings extending along a first direction;

a plurality of second wirings extending along a second direction crossing the first direction; and a plurality of memory cells, each of which is connected between one of the first wirings and one of the second wirings and includes a capacitor and a transistor connected in series, wherein the capacitor includes:

a first electrode, a second electrode, a first dielectric layer between the first and second electrodes, and comprising a first dielectric material including oxygen and at least one of hafnium and zirconium, a second dielectric layer between the first electrode and the first dielectric layer, and comprising a second dielectric material different from the first dielectric material; and an intermediate region between the first and second dielectric layers and in which a plurality of discrete metallic portions are provided, wherein the discrete metallic portions include metallic elements, wherein each of the first and second dielectric layers includes metallic elements that are same as the metallic elements included in the plurality of discrete metallic portions, a concentration of the metallic elements in the first dielectric material decreases as a distance from the intermediate region increases, and a concentration of the metallic elements in the second dielectric material decreases as a distance from the intermediate region increases.

* * * * *